(12) United States Patent
Hurkx et al.

(10) Patent No.: US 7,868,424 B2
(45) Date of Patent: Jan. 11, 2011

(54) SEMICONDUCTOR DEVICE AND METHOD OF MANUFACTURING THE SAME

(75) Inventors: Godefridus Adrianus Maria Hurkx, Eindhoven (NL); Prabhat Agarwal, Leuven (BE); Erwin Hijzen, Leuven (BE); Raymond Josephus Engelbart Hueting, Eindhoven (NL)

(73) Assignee: NXP B.V., Eindhoven (NL)

( * ) Notice: Subject to any disclaimer, the term of this patent is extended or adjusted under 35 U.S.C. 154(b) by 621 days.

(21) Appl. No.: 11/658,227

(22) PCT Filed: Jul. 7, 2005

(86) PCT No.: PCT/IB2005/052267

§ 371 (c)(1),
(2), (4) Date: Jan. 22, 2007

(87) PCT Pub. No.: WO2006/011073

PCT Pub. Date: Feb. 2, 2006

(65) Prior Publication Data

US 2008/0315361 A1   Dec. 25, 2008

(30) Foreign Application Priority Data

Jul. 20, 2004  (EP) ................................. 04103458
Apr. 8, 2005  (EP) ................................. 05102802

(51) Int. Cl.
  *H01L 21/02*  (2006.01)
(52) U.S. Cl. ................. 257/586; 257/565; 257/E29.185
(58) Field of Classification Search ................. 257/565, 257/586, E29.174, E29.185, E29.186
See application file for complete search history.

(56) References Cited

U.S. PATENT DOCUMENTS 4,586,071 A   4/1986  Tiwari et al.

(Continued)

FOREIGN PATENT DOCUMENTS

EP   1 229 589   8/2002

OTHER PUBLICATIONS

Hueting R J et al: "A New Trench Bipolar Transistor for RF Applications"; IEEE Transactions on Electron Devices N.Y. vol. 51 No. 7 Jul. 2004; pp. 1108-1113.

*Primary Examiner*—Zandra Smith
*Assistant Examiner*—Jamie Niesz

(57) ABSTRACT

The invention relates to a semiconductor device (10) with a substrate (11) and a semiconductor body (12) comprising a vertical bipolar transistor with an emitter region, a base region and a collector region (1, 2, 3) of, respectively, a first conductivity type, a second conductivity type opposite to the first conductivity type and the first conductivity type, wherein the collector region (3) comprises a first sub-region (3A) bordering the base region (2) and a second sub-region (3B) bordering the first sub-region (3A) which has a lower doping concentration than the second sub-region (3B), and the transistor is provided with a gate electrode (5) which laterally borders the first sub-region (3A) and by means of which the first sub-region (3A) may be depleted. According to the invention the collector region (3) borders the surface of the semiconductor body (12), while the emitter region (1) is recessed in the semiconductor body (12), and the collector region (3) forms part of a mesa structure (6) formed at the surface of the semiconductor body (12). Such a device (10) has very favorable properties at high frequencies and high voltages and, moreover, is easy to manufacture. In a preferred embodiment the collector (3) comprises a nanowire (30) forming the mesa structure (6).

20 Claims, 7 Drawing Sheets

U.S. PATENT DOCUMENTS

Figure 1:
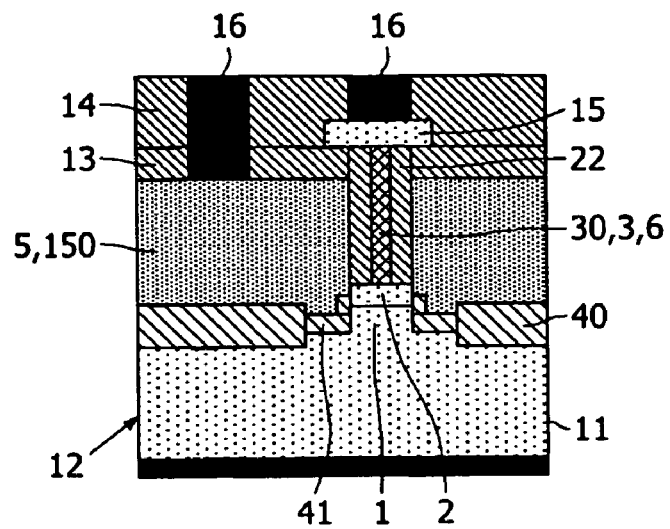
Figure 2:
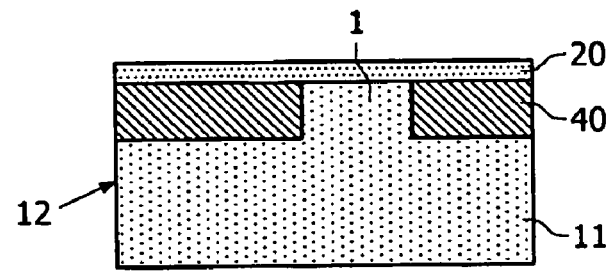
Figure 3:
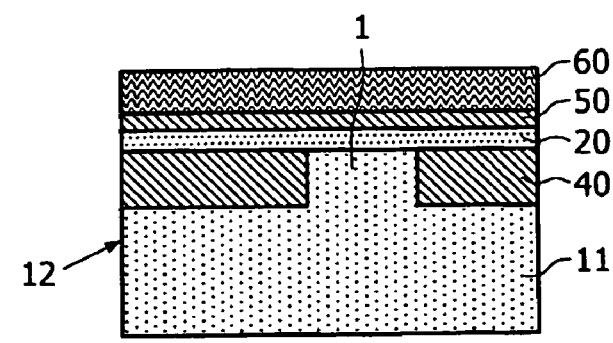
Figure 4:
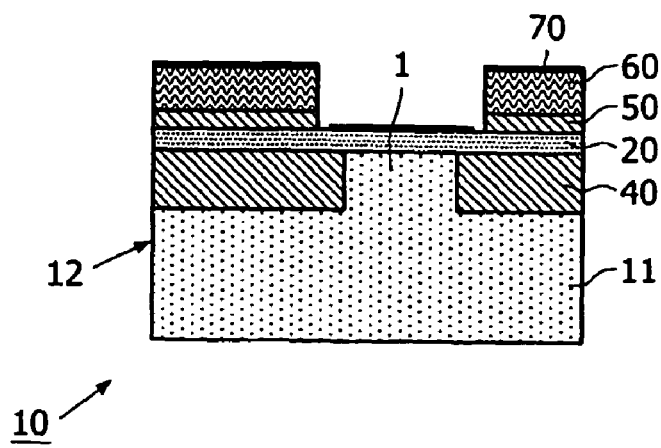
Figure 5:
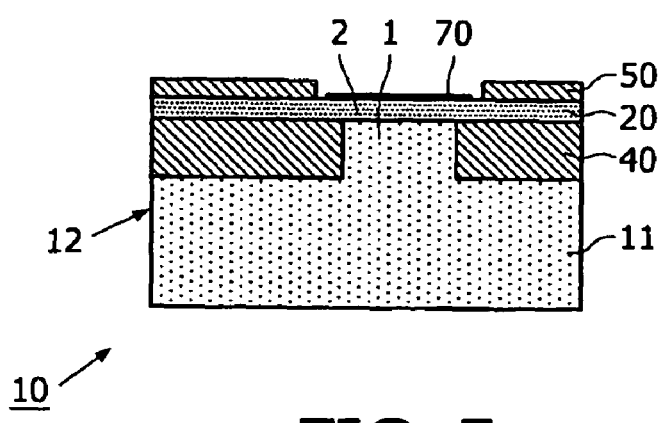
Figure 6:
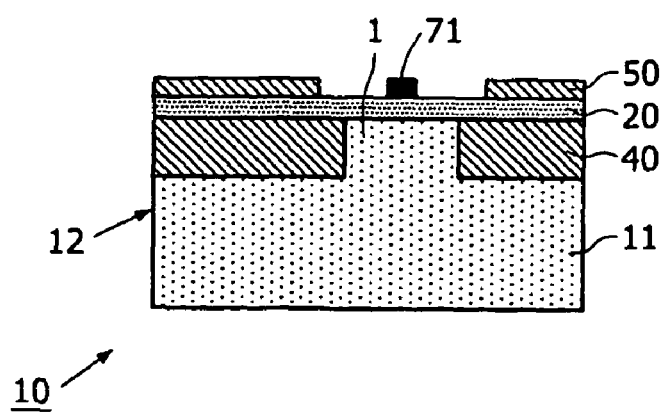
Figure 7:
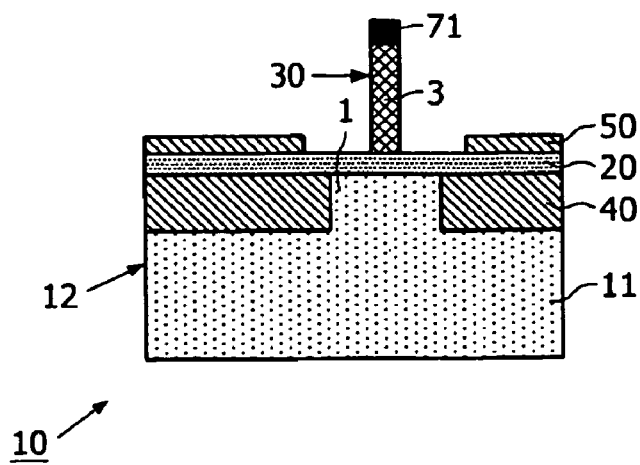
Figure 8:
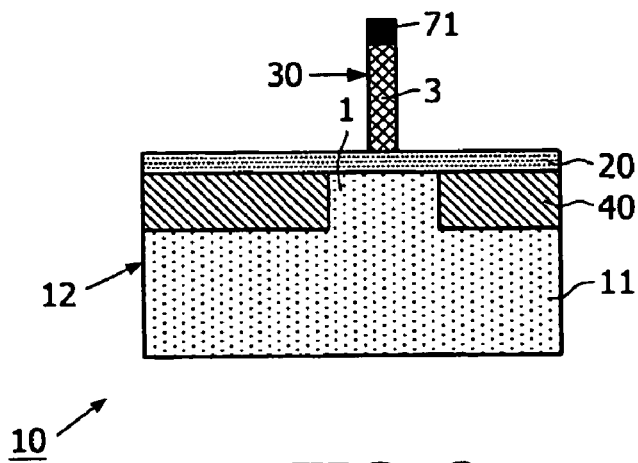
Figure 9:
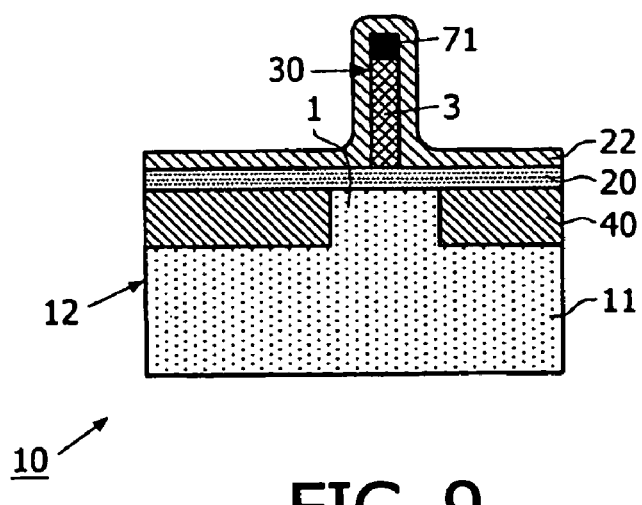
Figure 10:
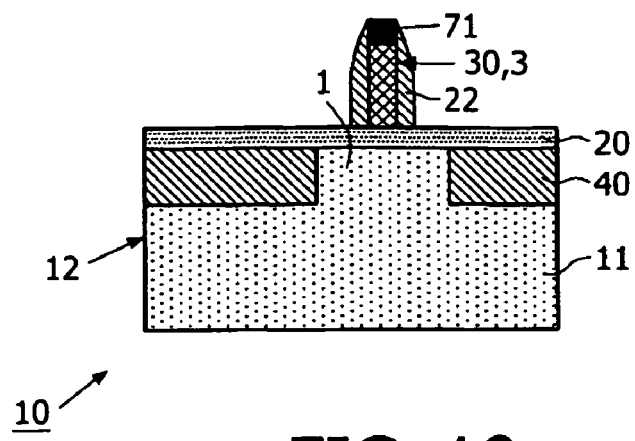
Figure 11:
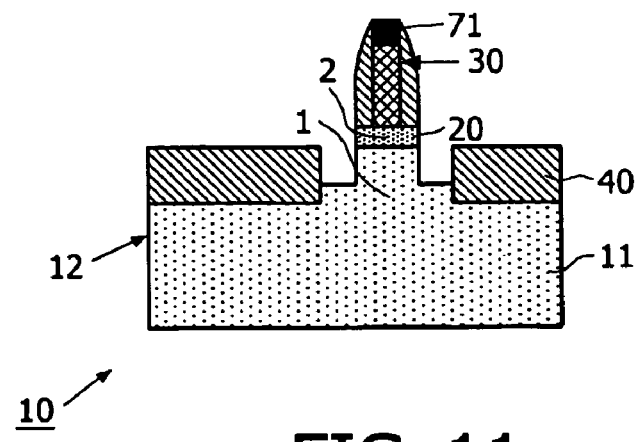
Figure 12:
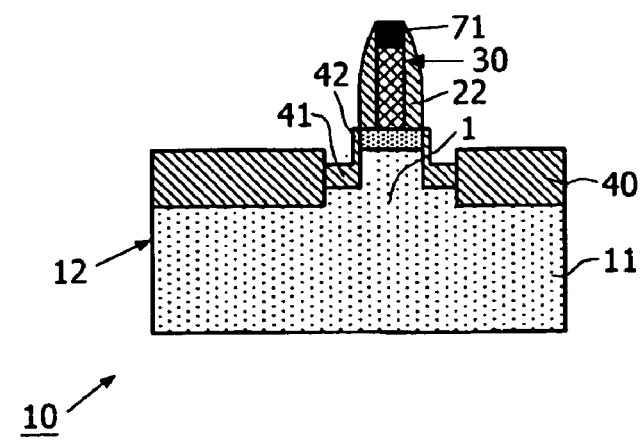
Figure 13:
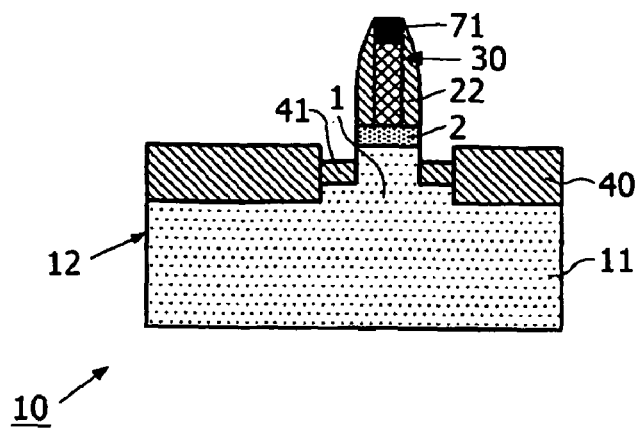
Figure 14:
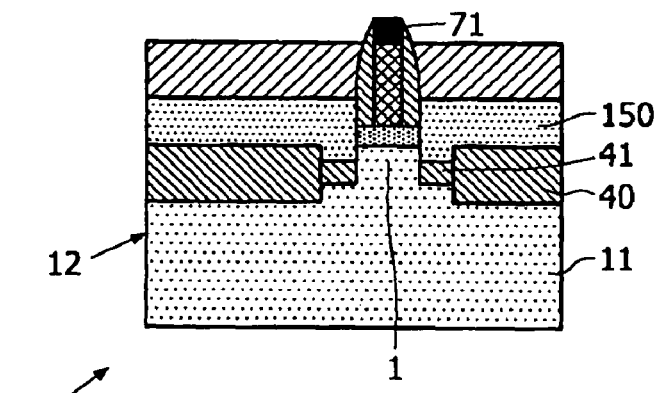
Figure 15:
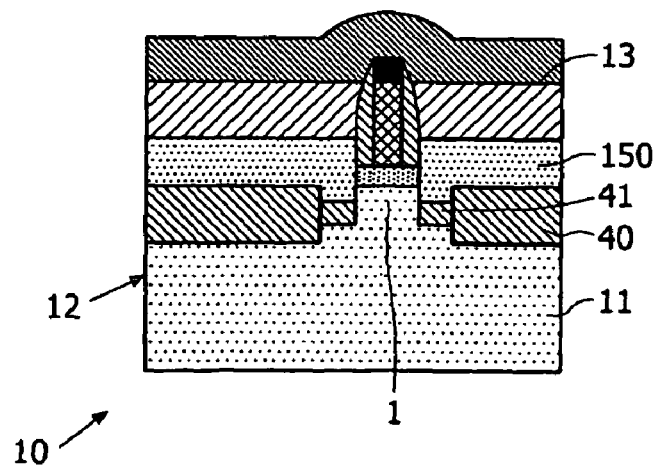

2003/0030488 A1* 2/2003 Hueting et al. ................ 330/57
2003/0186509 A1* 10/2003 Mochizuki et al. .......... 438/312
2004/0219773 A1* 11/2004 Choi et al. .................. 438/597
2007/0034909 A1* 2/2007 Stasiak et al. ............... 257/273

* cited by examiner

SEMICONDUCTOR DEVICE AND METHOD OF MANUFACTURING THE SAME

The invention relates to a semiconductor device with a substrate and a semiconductor body comprising a vertical bipolar transistor with an emitter region, a base region and a collector region of, respectively, a first conductivity type, a second conductivity type opposite to the first conductivity type and the first conductivity type, wherein the collector region comprises a first sub-region bordering on the base region and a second sub-region bordering on the first sub-region which has a lower doping concentration than the second sub-region, and the transistor is provided with a gate electrode which laterally borders on the first sub-region and by means of which the first sub-region can be depleted. Such a device is very suitably for high-frequency applications in which also a high voltage is applied. The collector region has a lightly doped part, as a result of which this part can be depleted comparatively easily by means of the gate electrode. By virtue thereof, a large product of threshold frequency and breakdown voltage between base and collector (or between emitter and collector) is possible. The invention also relates to a method of manufacturing such a device.

Such a device and such a method are known from patent specification WO 03/015178, published on 20 Feb. 2003 under said number. In said document a description is given of a vertical bipolar transistor and the manufacture thereof, said vertical bipolar transistor being recessed in a semiconductor body, and the emitter region being at the surface of the semiconductor body. The lower-lying collector comprises a highly doped connection region and a less highly doped drift region. The transistor is laterally bordered by a groove whose side wall accommodates a gate electrode by means of which the drift region can be depleted, resulting in the above-mentioned advantages.

A drawback of the known device resides in that the RF (=Radio Frequency) characteristics are not optimal yet. Besides, the manufacture of the device is not very easy.

Therefore, it is an object of the present invention to provide a device and a method which yield improved RF properties, while the method enables the device to be readily manufactured.

To achieve this, a device of the type mentioned in the opening paragraph is characterized in accordance with the invention in that the collector region borders on the surface of the semiconductor body, while the emitter region is recessed in the semiconductor body, and the collector region forms part of a mesa structure formed at the surface of the semiconductor body. A reversal of the position of the emitter and the collector in the vertical direction already results in improved RF properties. Positioning the collector region in a mesa structure bordering the surface of the semiconductor body has a number of advantages, such as inter alia a further improvement of the RF properties. This can be attributed, on the one hand, to the comparatively small collector-base capacitance associated with such a mesa structure. On the other hand, such a structure more readily enables a collector region having very small lateral dimensions to be formed. By virtue thereof, the effectiveness for the RF properties of the gate electrode is substantially improved. Besides, such a mesa structure in itself can be manufactured comparatively easily and, in addition, the provision of the gate electrode is easier with such a structure as compared to the known device.

In addition, the behavior of a device in accordance with the invention can be improved, because the doping level in the base region can be reduced without this causing full depletion of the base region. This can be attributed to the fact that the depletion region of the base-collector junction can extend laterally in the base. This leads to higher currents and a higher speed. The same effect also enables a higher Early voltage to be realized, as a result of which the transistor has more ideal characteristics.

In a first embodiment the base region and the collector region are formed in a semiconductor layer structure which is provided on the emitter region and in which the mesa structure is formed by means of etching. In this manner a vertical bipolar transistor in accordance with the invention is formed in a simple manner.

In a preferred embodiment of a device in accordance with the invention, the base region is formed by means of a layer-shaped region at the surface of the semiconductor body, the emitter region is formed in the semiconductor body under the base region and the mesa structure comprises a nanowire which is provided on the surface of the semiconductor body in such a manner that its longitudinal axis extends substantially perpendicularly to the surface thereof. Such a device can be readily manufactured by means of a method in accordance with the invention and exhibits excellent RF and breakdown voltage characteristics.

In this application, the term "nanowire" is to be taken to mean a body of which at least one lateral dimension lies in the range between 0.5 nm and 100 nm, more particularly between 1 and 50 nm. Preferably, dimensions of the nanowire in two lateral directions lie in said ranges. Such lateral dimensions cannot, or at least not easily, be achieved by means of photo-lithography; however, such dimensions are desirable, inter alia, in connection with the ongoing miniaturization in the IC (=Integrated Circuit) technology. In this connection, besides component density, also speed, breakdown voltage and current and/or power consumption of the semiconductor elements, in this case the bipolar transistor(s), play a very important role.

The comparatively high breakdown voltage of a device in accordance with the invention is possible by virtue of the following properties. In the first place, the maximum electric field is reduced by virtue of a comparatively large thickness of the depletion region in the nanowire. This in turn can be attributed to the comparatively small surface of the nanowire comprising the collector region as compared to the surface of the base region. Furthermore, the maximum electric field is reduced by virtue of the enhanced effectiveness of the gate electrode.

Preferably a selective deposition process is applied, particularly when use is made of a nanowire, to form the collector region. By virtue thereof, not only very small lateral dimensions can be achieved, but also the use of a semiconductor material with a large bandgap for the collector region is made easier. Such a material contributes to a further improvement of the desired properties, because the generation of electron-hole pairs by impact ionization is less easy in this material.

In a favorable embodiment the nanowire therefore comprises a material having a larger bandgap. Preferably the nanowire is provided with a spacer, and the base region is formed in a self-aligning manner with respect to the nanowire provided with the spacer. A spacer of an electrically insulating material can also be used to form the gate electrode. The semiconductor material preferably comprises silicon.

A method of manufacturing a semiconductor device with a substrate and a semiconductor body in which a vertical bipolar transistor is formed comprising an emitter region, a base region and a collector region of, respectively, a first conductivity type, a second conductivity type opposite to the first conductivity type and the first conductivity type, wherein the collector region is provided with a first sub-region bordering on the base region and with a second sub-region bordering on the first sub-region, which has a lower doping concentration than the second sub-region, and wherein the transistor is provided with a gate electrode which is formed so as to laterally border the first sub-region and by means of which the first sub-region can be depleted, is characterized in accordance with the invention in that the collector region is formed so as to border the surface of the semiconductor body, while the emitter region is formed so as to be recessed in the semiconductor body, and the collector region is formed so as to form part of a mesa structure formed at the surface of the semiconductor body. In this manner, a device in accordance with the invention is obtained in a simple manner.

In an embodiment of a method in accordance with the invention, the base region and the collector region are formed in a semiconductor layer structure which is provided on the emitter region and the mesa structure is formed therein by means of etching. The application of etching from the surface in combination with the use of a mask is comparatively simple.

A modification is characterized in that after the formation of the mesa structure a first electrically insulating layer, a conductive layer and a second electrically insulating layer are applied thereon, after which the upper side of the mesa structure is exposed again by means of chemical-mechanical polishing. In this manner, the transistor can be provided with the gate electrode in a simple manner. Via the end faces of a conductive layer used to form the gate electrode, a small part of said layer can be removed again, for example by etching, and the cavity can be filled with an insulating material. As a result, it becomes easier to prevent a short circuit between the gate electrode and the collector connecting conductor. This variant is suitable, inter alia, for the manufacture of a device in accordance with the invention, wherein separate connection regions are formed for the base region and the gate electrode.

In an important embodiment, the base region is formed by means of a layer-shaped region at the surface of the semiconductor body, the emitter region is formed below the base region in the semiconductor body and the mesa structure is formed as a nanowire which is provided on the surface of the semiconductor body such that its longitudinal axis extends perpendicularly to said surface. Preferably the nanowire is formed by means of a selective deposition technique. Advantageously the nanowire is provided with a spacer.

In a favorable modification, the nanowire provided with the spacer is buried by means of an electrically conductive layer and a first insulating layer, after which the structure is planarized. Preferably, a conductive region having a larger cross-section than the nanowire is formed at the exposed end portion of said nanowire, after which a second insulating layer is provided on the structure, and openings are formed in said second insulating layer which extend as far as the electroconductive layer and the electroconductive region, and the openings are subsequently filled by means of a conductive material.

These and other aspects of the invention are apparent from and will be elucidated with reference to the embodiment(s) described hereinafter.

Figure 16:
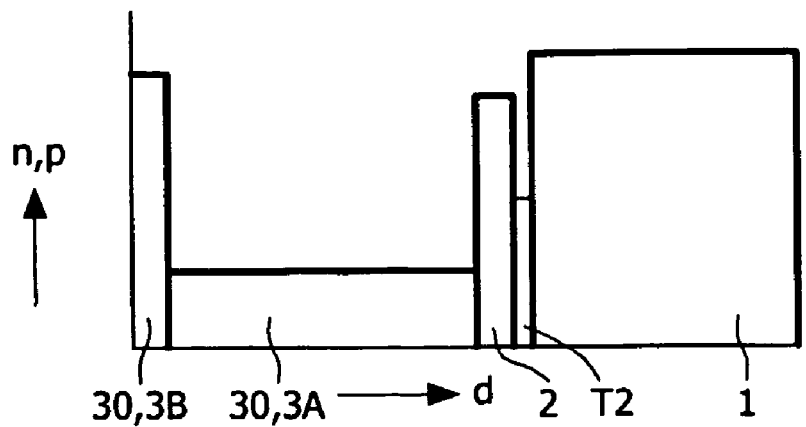
Figure 17A:
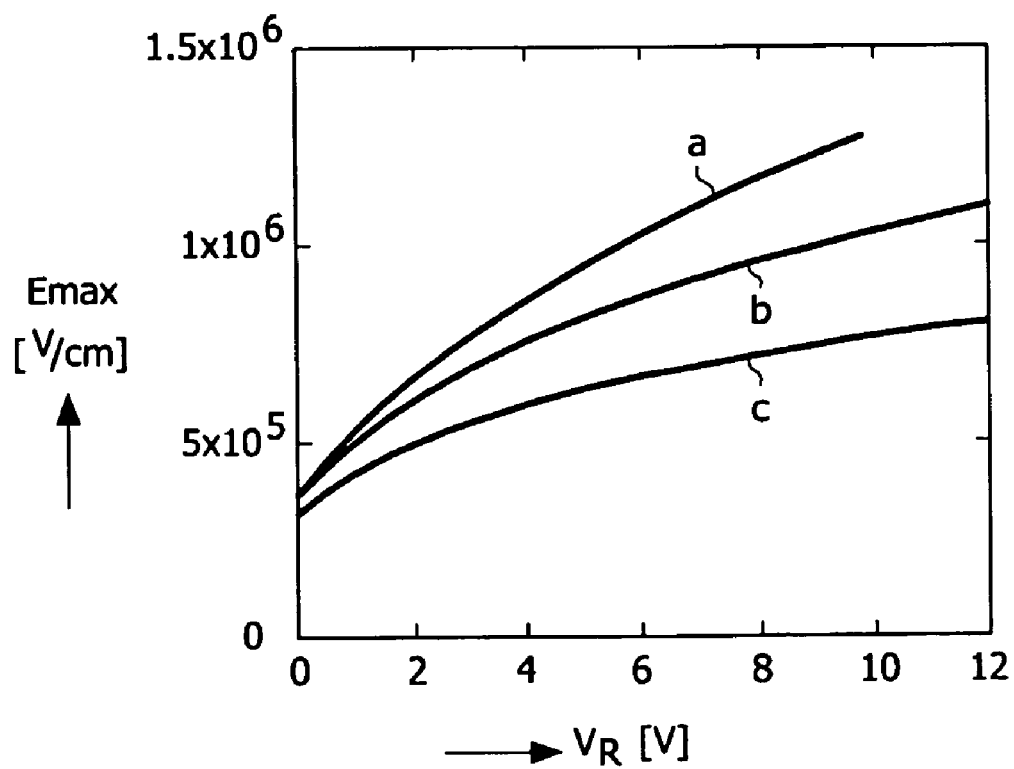
Figure 17B:
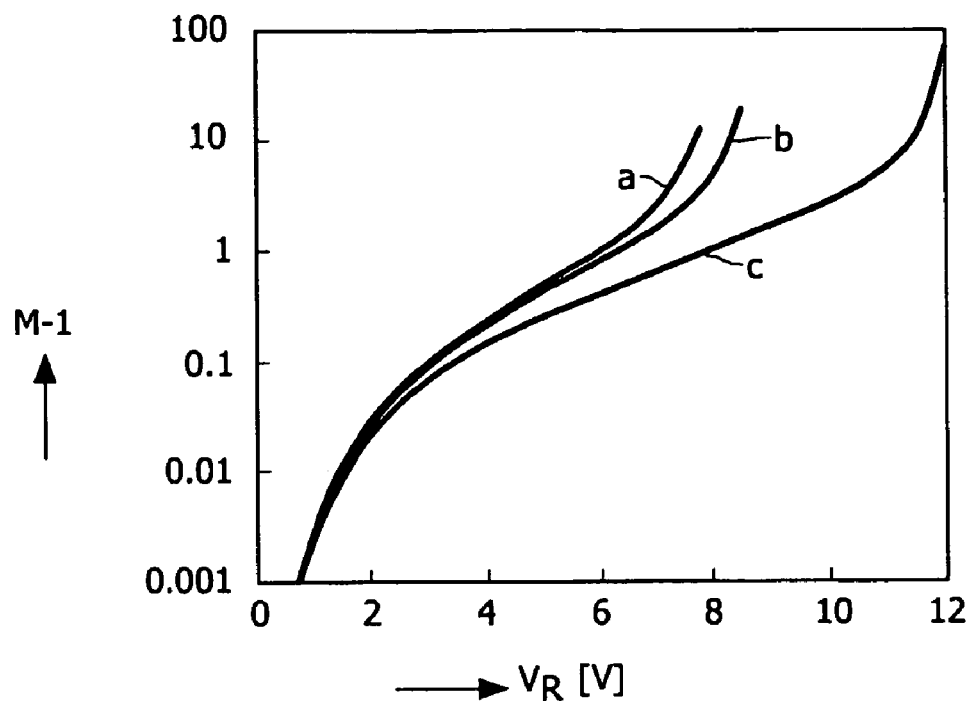
Figure 18:
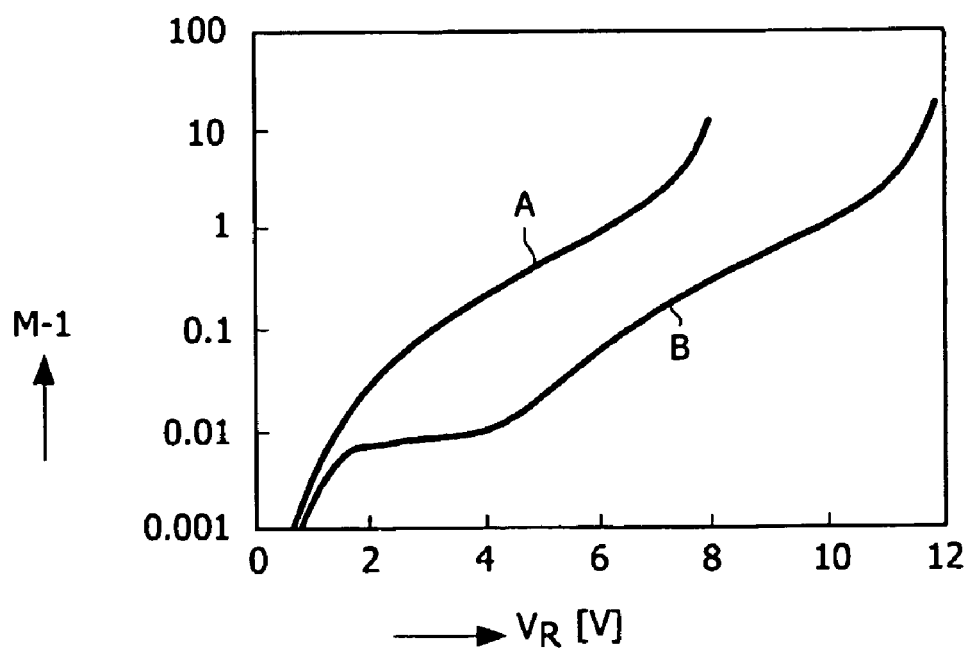

In the drawings:

FIG. 1 is a diagrammatic cross-sectional view, at right angles to the thickness direction, of an embodiment of a semiconductor device in accordance with the invention, FIGS. 2 through 15 are diagrammatic cross-sectional views, at right angles to the thickness direction, of the device of FIG. 1 in successive stages of the manufacturing process by means of an embodiment of a method in accordance with the invention, FIG. 16 diagrammatically shows the variation of the doping concentration in the thickness direction for the transistor of the device shown in FIG. 1, FIGS. 17A and 17B illustrate the influence of the dimensions of the device shown in FIG. 1 on, respectively, the maximum field strength and the multiplication coefficient as a function of the voltage, and FIG. 18 illustrates the influence of the presence of the gate electrode of the device shown in FIG. 1.

The Figures are not drawn to scale and some dimensions are exaggerated strongly for clarity. Whenever possible, corresponding regions or parts are provided with the same hatching and the same reference numerals.

FIG. 1 is a diagrammatic cross-sectional view, at right angles to the thickness direction, of a first embodiment of a semiconductor device 10 comprising a vertical bipolar transistor in accordance with the invention. The device 10 of this example comprises (see FIG. 1) a substrate 11, in this case an n-type silicon substrate, on which a, in this case p-type, semiconductor region 2 is present which forms a base region 2 of the transistor containing, in this case, a mixed crystal of SiGe (Ge content of approximately 25 at. %) and having a thickness of approximately 20 nm. The base region 2 is situated on the n-type emitter region 1, which is formed in the semiconductor body between insulation regions 40, 41, here in the form of a so-termed trench isolation. On top of the base region 2 there is a collector region 3 of the transistor which, in this case, comprises a nanowire 30 of silicon which has a diameter of approximately 10 nm, a height of 100 nm, and which forms a mesa structure 6. Around said nanowire there is a spacer 22, in this case of silicon dioxide, having a width of approximately 10 nm. The collector region 3 comprises a (thinner) highly doped region 3B and a (thicker) lightly doped part 3A bordering the base region 2.

Around the nanowire 30, 3 there is, in this case, a conductive region 150 which contains, in this case, polycrystalline silicon and which is in direct communication with the side faces of the base region 2. The conductive region 150 forms, in this case, a connection region of the base region 2 as well as the gate electrode 5 by means of which the lightly doped part of the collector region 3 bordering the base region can be depleted. Here, this is achieved by choosing the thickness of the conductive region 150 to be such that it extends beyond the lightly doped part of the collector region 3. Besides being self-aligning, this embodiment is very compact too. This variant can be advantageously used in a device 10 comprising a large number of separate transistors. On the conductive region 150 there are two electrically insulating layers 13, 14 of, for example, silicon dioxide. On the nanowire 30 there is a (larger) connection region 15, in this case of polycrystalline silicon, for the collector 3. Above the conductive region 5, 150, openings are formed in the insulating layer/layers 13, 14, which are filled with a conductive material 16, for example a metal such as aluminum or copper, which serve as connection regions for, on the one hand, the base region and the gate electrode and, on the other hand, the collector region. The substrate region 11 may of course also be a so-termed n-well which is formed in a p-type silicon substrate. The device 10 of this example may be manufactured in the manner described hereinbelow, using a first embodiment of a method in accordance with the invention.

FIGS. 2 through 15 are diagrammatic cross-sectional views, at right angles to the thickness direction, of the device of FIG. 1 in successive stages of the manufacturing process by means of an embodiment of a method in accordance with the invention. An n-type substrate 11 of silicon is used as the starting material (see FIG. 2). In said substrate, insulation regions 40 of silicon dioxide are formed. An epitaxial layer 20 of SiGe is then provided on this structure by means of gas-phase epitaxy, said epitaxial layer being polycrystalline above the insulation regions 40 and monocrystalline between said insulation regions.

Subsequently (see FIG. 3), an insulating layer 50, in this case of silicon dioxide, is provided by means of, in this example, CVD (=Chemical Vapor Deposition) on the SiGe layer 20. A photoresist layer 60 is provided on top of said insulating layer.

The resist layer 60 is patterned by means of photolithography (see FIG. 4), after which, in the opening in the resist layer 60, the insulating layer is locally removed by means of etching. Subsequently, a metal layer, in this case a 10 nm thick Au layer 70, is provided on the resultant structure by means of, in this case, evaporation.

Next (see FIG. 5), a lift-off process, in which the resist layer 60 is removed, is applied to remove the parts of the Au layer 70 which are situated on top of the resist layer 60. As a result, the Au layer 70 is present only directly on the SiGe layer 20.

Next (see FIG. 6), the remaining part of the Au layer 70 is melted by exposure to heat, in which process a droplet-shaped area 71 of Au forms at an increased temperature. In this example, a small quantity of silicon is dissolved therein.

Subsequently (see FIG. 7), a nanowire 30, in this case of silicon, is grown on the SiGe layer 20 by means of a gas-phase growth process. In said process, the droplet-shaped metal region 71 is raised as it were, as a result of which it is situated on top of the nanowire 30. Said wire 30 forms the collector region 3 of the transistor to be formed. During the growth process, the wire 30 is provided with the doping profile in the axial direction as chosen in this example. It is explicitly noted here that the material used for the nanowire 30 may also advantageously be a III-V material, such as preferably GaP which has a comparatively large bandgap and the lattice constant of which deviates comparatively little from that of silicon.

Subsequently (see FIG. 8), the remaining parts of the insulating layer 50 are removed by means of etching and, (see FIG. 9), an electrically insulating layer 22 is provided over the structure. By means of an anisotropic etch process (see FIG. 10), the planar parts of the layer 22 are removed again, so that the nanowire 30 is provided with a spacer 22 surrounding said nanowire 30.

Subsequently (see FIG. 11), a part of the semiconductor body 12 adjacent the nanowire 30 is removed by means of etching. Next (see FIG. 12), a wet thermal oxidation process is carried out at the location of the recess in the semiconductor body 12, as a result of which electrically insulating regions 41 are formed at the surface of the semiconductor body. As the substrate 11 (emitter 1) is much higher doped than the base region 2, the insulating region 41 on the side faces of the base region 2 is much thinner than at the location where this region 41 borders the substrate 11. By briefly etching the insulating region 41 (see FIG. 13), the side faces of the base region 2 are exposed again.

Next (see FIG. 14), the polycrystalline silicon region 150 is formed. This can be achieved by means of, for example, CVD. In this example use is made, for this purpose, of a selective epitaxial growth process for growing the connection region for the base 2 on the side walls of the base 2.

Next (see FIG. 15), a first electrically insulating layer 13 is provided over the structure, after which a planarization step using CMP (=Chemical Mechanical Polishing) is carried out. In this example, also the droplet-shaped metal region 71 above the nanowire 30 is removed in this planarization step.

Subsequently (see FIG. 1), a polycrystalline silicon connection region 15 is formed which electrically contacts the nanowire 30 and which has larger lateral dimensions than said nanowire 30. This is achieved, in this case, by applying a uniform layer of doped poly Si, which is subsequently patterned by means of photolithography and etching.

Finally (see FIG. 1), a second electrically insulating layer 14 of silicon dioxide is provided. In said insulating layer, channel-shaped openings are formed which run to the conductive region 5, 150 and to the collector connection region 15, which openings are filled with a metal 16, such as aluminum or copper.

It is further noted that the conductive region 150, (see FIG. 14), can also be formed by carrying out a uniform deposition process, such as a CVD process, over the nanowire 30 followed by a planarization step by means of CMP. The first insulating layer 13, (see FIG. 15), can be provided in the same way prior to said CMP step. Said layer can alternatively be provided after said CMP step.

FIG. 16 diagrammatically shows the variation of the doping concentration in the thickness direction for the transistor of the device shown in FIG. 1. The importance of this doping profile in the axial direction of the nanowire 30 forming the collector 3 of the transistor has been pointed out hereinabove.

FIGS. 17A and 17B illustrate the influence of the dimensions of the device of FIG. 1 on, respectively, the maximum field strength Emax and the multiplication coefficient M as a function of the reverse voltage $V_r$ across the junction between base and collector. In the Figures, M−1 is plotted and M is, in this case, the multiplication coefficient for electrons. Curves a, b and c correspond to, respectively, a 1-dimensional situation at equal surfaces, a nanowire with a diameter of 50 nm and a nanowire with a diameter of 20 nm. The Figures show that a smaller diameter and hence a smaller surface of the collector region leads to an increased extension of the depletion region therein, as a result of which the maximum electric field strength is reduced. As a result, the multiplication coefficient is reduced and hence the breakdown voltage increased.

FIG. 18 illustrates the influence of the presence of the gate electrode of the device shown in FIG. 1. Also in this case, M−1 is plotted (M being the multiplication coefficient) as a function of $V_r$ (the voltage across the collector-base junction) for the 1-dimensional situation without a field plate (gate electrode) in curve A and for the situation with a field plate (gate electrode) in curve B. As the multiplication coefficient M is substantially lower in the last-mentioned case, the breakdown voltage of the collector is substantially higher in said case.

The invention is not limited to the exemplary embodiments described herein, and within the scope of the invention many variations and modifications are possible to those skilled in the art. For example, the invention can be applied not only in a bipolar device but also in a Bi(C)MOS (Bipolar (Complementary) Metal Oxide Semiconductor) IC (=Integrated Circuit). The invention can also be applied to PNP transistors. Besides ICs, the invention can be applied to discrete bipolar transistors.

It is further noted that instead of STI isolation regions, use can be made of isolation regions obtained by means of the LOCOS (=Local Oxidation Of Silicon) technique. Besides a mixed crystal of Si—Ge for the base, other mixed crystals can be advantageously used, such as a mixed crystal of Si and C or pure Si.

It is further expressly noted that instead of a conductive gate electrode which is separated from the semiconductor body by means of an insulating layer, also a gate electrode in the form of a so-termed SIPOS (=Semi-Insulating Polycrystalline Silicon) layer may be applied. Also a gate electrode based on a p-i-n diode can be used. In this case, the voltage drop takes place across the i-region.

Finally, it is noted once again that the gate electrode and the connecting conductor of the base region may also be provided with separate connections. This requires an adaptation of the manufacturing process in minor ways only. A suitable method for this modification employs a comparatively thin conductive layer which is deposited over the mesa structure and which covers the (electrically insulated) flanks of the mesa. This layer may be interrupted at some distance from the mesa to form separate connections of the base region and the gate electrode.

The invention claimed is:

1. A semiconductor device with a substrate and a semiconductor body comprising a vertical bipolar transistor with an emitter region, a base region and a collector region of, respectively, a first conductivity type, a second conductivity type opposite to the first conductivity type and the first conductivity type, wherein the collector region comprises a first sub-region bordering on the base region and a second sub-region bordering on the first sub-region which has a lower doping concentration than the second sub-region and the transistor is provided with a gate electrode which laterally borders on the first sub-region and by means of which the first sub-region can be depleted, characterized in that the collector region borders on the surface of the semiconductor body while the emitter region is recessed in the semiconductor body and the collector region forms part of a mesa structure formed at the surface of the semiconductor body, wherein the gate electrode is separated from the semiconductor body by an insulating layer.

2. A semiconductor device as claimed in claim 1, characterized in that the base region and the collector region are formed in a semiconductor layer structure which is provided on the emitter region and in which the mesa structure is formed by means of etching.

3. A semiconductor device as claimed in claim 1, characterized in that the base region is formed by means of a layer-shaped region at the surface of the semiconductor body, the emitter region is formed in the semiconductor body under the base region and the mesa structure comprises a nanowire which is provided on the surface of the semiconductor body in such a manner that its longitudinal axis extends perpendicularly to the surface thereof.

4. A semiconductor device as claimed in claim 3, characterized in that the nanowire is formed by means of a selective deposition process.

5. A semiconductor device as claimed in claim 3, characterized in that the nanowire comprises a semiconductor material with a larger bandgap than the semiconductor material of the semiconductor body.

6. A semiconductor device as claimed in claim 3, characterized in that the nanowire is provided with a spacer and the base region is formed in a self-aligning manner with respect to the nanowire provided with the spacer.

7. A semiconductor device as claimed in claim 1, characterized in that the base region and the gate electrode have a common connection.

8. A semiconductor device as claimed in claim 1, characterized in that the semiconductor body contains silicon.

9. A semiconductor device as claimed in claim 1, characterized in that the base region contains a mixed crystal of SiGe.

10. A semiconductor device as claimed in claim 9, characterized in that the base region has a thickness of approximately 20 nanometers.

11. A semiconductor device as claimed in claim 1, characterized in that the base region contains a mixed crystal of Si and C.

12. A semiconductor device as claimed in claim 1, characterized in that the base region contains pure Si.

13. A semiconductor device as claimed in claim 1, characterized in that the gate electrode is in the form of a semi-insulating polycrystalline silicon.

14. A semiconductor device as claimed in claim 1, characterized in that the gate electrode is based on a p-i-n diode.

15. A semiconductor device as claimed in claim 1, characterized in that the mesa structure comprises a nanowire that is buried by an electrically conductive layer and another insulating layer.

16. A semiconductor device with a substrate and a semiconductor body comprising a vertical bipolar transistor with an emitter region, a base region and a collector region of, respectively, a first conductivity type, a second conductivity type opposite to the first conductivity type and the first conductivity type, wherein the collector region comprises a first sub-region bordering on the base region and a second sub-region bordering on the first sub-region which has a lower doping concentration than the second sub-region and the transistor is provided with a gate electrode which laterally borders on the first sub-region and by means of which the first sub-region can be depleted, characterized in that the collector region borders on the surface of the semiconductor body while the emitter region is recessed in the semiconductor body and the collector region forms part of a mesa structure formed at the surface of the semiconductor body, characterized in that the base region is formed by means of a layer-shaped region at the surface of the semiconductor body, the emitter region is formed in the semiconductor body under the base region and the mesa structure comprises a nanowire which is provided on the surface of the semiconductor body in such a manner that its longitudinal axis extends perpendicularly to the surface thereof, wherein the nanowire is buried by an electrically conductive layer and an insulating layer.

17. A semiconductor device as claimed in claim 16, characterized in that the nanowire is formed by means of a selective deposition process.

18. A semiconductor device as claimed in claim 17, characterized in that the nanowire comprises a semiconductor material with a larger bandgap than the semiconductor material of the semiconductor body.

19. A semiconductor device as claimed in claim 18, characterized in that the nanowire is provided with a spacer and the base region is formed in a self-aligning manner with respect to the nanowire provided with the spacer.

20. A semiconductor device as claimed in claim 16, characterized in that the base region and the collector region are formed in a semiconductor layer structure which is provided on the emitter region and in which the mesa structure is formed by means of etching.

* * * * *